United States Patent [19]

Hudgins et al.

[11] Patent Number: 4,908,740

[45] Date of Patent: Mar. 13, 1990

[54] INTEGRAL COMPOSITE STRUCTURE WITH PREDETERMINED ELECTRICALLY CONDUCTIVE NETWORKS AND METHOD FOR PRODUCING SAME

[76] Inventors: Richard D. Hudgins, 3217 Olive Hill Rd., Fallbrook, Calif. 92028; Scott Carr, 6355 Smith Ave., Mira Loma, Calif. 91752

[21] Appl. No.: 309,826

[22] Filed: Feb. 9, 1989

[51] Int. Cl.[4] .............................................. F21V 33/00
[52] U.S. Cl. .................................. 362/144; 362/83.1; 362/141; 427/96
[58] Field of Search ............... 174/68.5; 252/512, 513, 252/514; 362/61, 80, 80.1, 83.1, 140, 141, 142, 144; 427/96

[56] References Cited

U.S. PATENT DOCUMENTS

| | | | |
|---|---|---|---|
| 2,018,343 | 10/1935 | Bienfait et al. | 428/381 |
| 3,310,433 | 3/1967 | Tragert | 427/105 |
| 4,084,314 | 4/1978 | Chakrabarty et al. | 174/68.5 X |
| 4,303,733 | 12/1981 | Bulle et al. | 428/367 |
| 4,571,453 | 2/1986 | Takaoka et al. | 174/110 A |
| 4,634,805 | 1/1987 | Orban | 174/128 R |
| 4,744,645 | 5/1988 | Sharp | 362/144 X |
| 4,760,503 | 7/1988 | VandenBerge et al. | 362/144 X |

Primary Examiner—Stephen F. Husar
Attorney, Agent, or Firm—Ben E. Lofstedt; Cleveland R. Williams

[57] ABSTRACT

An integral composite structure having predetermined electrically conductive networks on a non-conductive planar or non-planar support structure produced by the combination of a slurry of electrically conductive materials having a fluid carrier which includes an evaporative fluid and an elastomeric substance in which particles of an electrically conductive material are contained, the fluid carrier being chemically reactive with the material forming the relatively non-conductive support structure to secure one to the other, and upon evaporation of the evaporative portion of the fluid carrier, the unevaporated portion of the slurry formed of the elastomeric substance and the electrically conductive particles form a solid which is both flexible and electrically conductive and a method for producing same, including the steps of introducing the slurry into a container, the container having at least a portion of the wall forming the container consisting of an elastomeric material having at least one normally closed orifice therein arranged in a desired pattern, which without the application of pressure to the slurry remains closed, juxtapositioning the wall having the orifice therein relative to the support structure upon which the slurry is desired to be deposited upon, pressurizing the slurry within the container to force the slurry through the normally closed orifice with sufficient pressure to force the slurry into inlet of the orifice passageway in the elastomeric material, displacing the elastomeric material surrounding the orifice and thereby opening the normally closed orifice and causing the slurry to flow through the orifice and to exit the orifice outlet, depositing the slurry exiting from the outlet of said at least one orifice onto the electrically non-conductive support structure in the desired pattern, allowing the slurry to chemically react with the material forming the support structure and to create a bond therebetween, and then evaporating the fluid carrier to leave a flexible, solid residue which is electrically conductive and is integrally secured to the support structure to form an integral composite structure having predetermined electrically conductive networks.

19 Claims, 2 Drawing Sheets

INTEGRAL COMPOSITE STRUCTURE WITH PREDETERMINED ELECTRICALLY CONDUCTIVE NETWORKS AND METHOD FOR PRODUCING SAME

BACKGROUND OF THE INVENTION

1. Field of the Invention:

The present invention relates to an integral composite structure and method for forming same which includes a preselected pattern of electrically conductive pathways on preformed plastic parts thereby eliminating the need for separate electrical wiring, and, more particularly, to an integral composite structure and method for forming same having predetermined electrically conductive networks on a non-conductive, support structure, either planar or non-planar, which is formed by the combination of a relatively non-conductive slurry of electrically conductive materials having a carrier which includes a volatile fluid and an elastomeric substance in which particles of an electrically conductive material are suspended, the carrier being chemically reactive with the material forming the relatively non-conductive support structure so that following the combination of the slurry with the support structure the carrier reacts chemically with the support structure to create a bond therebetween and upon the deposition of a slurry of polymer-based materials which upon solidification forms an electrically conductive solid coating.

2. Description of the Prior Art:

Polymer thick conductors, often referred to as conductive "inks", for high-speed printing of flexible, electrically conductive patterns onto various types of non-conductive base surfaces, are known to exist in the prior art. Such inks typically are formed by combining silver metal particles of the desire mesh size, frequently 200 mesh, or 0.0021 inch diameter, mixed with a polymer-/elastomeric carrier. Upon curing, the dried ink forms an excellent electrical conductor. Such are used in the formation of membranes for computer keyboards, and for deposition onto cloth, or paper, products.

There are various methods used for application of such conductive inks to non-conductive base surfaces. Such methods found in the prior art include screen printing, letterpress, Flexographic and Offset, as well as plating, painting, or electroplaining techniques. All of these methods share the problems encountered with perhaps the most frequently used technique is the use of the well-known screen printing process identified as "silk screen" printing. While such prior art techniques for applying the polymer conductive inks to a base surface are used, the silk screen method is not without its difficulties.

One problem which has known to plague the use of the silk screen method is that the very nature of the silk screen process is inherently wasteful of the relatively expensive polymer conductive ink material. In order to apply such conductive inks in a pattern established by the silk screen, the silk screen must be saturated with the conductive ink. The conductive ink held by the silk screen is then forced into the silk screen mesh typically by the manual manipulation of a squeegee passed thereinover and is deposited onto the non-conductive base disposed on the opposite side of the silk screen material upon removal of screen contact with the part. In this process, only a small fraction of the conductive ink held by the silk screen itself will be effectively transferred to the non-conductive base material; the balance remaining in the silk screen material is, for all intents and purposes, lost and wasted. Of course, perhaps several another non-conductive base material items can be inserted thereinunder before the conductive inks solidify. Nevertheless, when production ceases at some point in time, the ink which remains captured in the silk screen will solidify and be effectively lost and no longer will be usable for the purpose intended. At $30.00 dollars, or so, per ounce this can become a very expensive proposition rather quickly.

Another significant problem encountered with the use of the silk screen process involves the deposition of such electrically conductive inks on relatively large areas of the silk screen itself as compared to the designated ink transfer area of the silk screen and exposing the unused portion to air and thus drying continuously. In essence, there is a significantly substantial waste factor associated with the silk screen process.

Further, silk screen cannot easily be applied, or used, for non-planar applications.

In a great many applications, electrically conductive wires formed of drawn copper or aluminum metal and coated with plastic, rubber or other non-electrically conductive materials, are used to conduct electricity from the electrical power source to the desired point of use. However, the use of such wiring is costly in a great number of applications because of its manual labor-intensive mode of installation in a given application. In other applications, it simply cannot be used because of the relatively large size of the solid metal wiring, whether insulated or uninsulated. In short, the use of such wiring is virtually a "custom" installation and presents a very high cost means of conducting electrical energy from its source to point of use.

In a number of other electrical applications, such electrically conductive paths are created using printed circuit boards, multi-layer printed circuit boards, and the like, are created by etching away portions of an electrically conductive metallic substance clad to a non-electrically conductive planar base by a combination of masking and a liquid chemical suitable for removing the electrically conductive metallic substance from the non-conducting base material.

Sometimes an electrically conductive material is sprayed onto a non-electrically conductive base, by electrical or gas plasma methods to form a particular pattern of electrically conductive pathways on the base material.

All of the prior art methods while usable, are frequently undesirable for one or more reasons, such as being too costly to apply, excessive labor intensive installation, produces toxic or non-toxic waste during and after its application or formation, or requires costly machinery to effectuate their use, application and formation.

An additional problem which is frequently encountered in the use of prior art methods enumerated herein is the extreme difficulty in producing acceptable quantities of relatively large non-planar composite structures of the type characterized herein.

Use of the present method to form such electrically conductive pathways on a preformed support structure largely overcomes the objections of prior art methods and devices in the creation of such electrically conductive pathways in not only planar structures but non-planar structures as well.

The present method represents a new and novel advance in the state of the art of installing, supporting and forming partially insulating electrically conductive pathways as an integral part of the modular device to be electrically powered.

In utilizing such a new and novel approach to the integration of electrically conductive pathways on a non-electrically conductive base expense, weight, and space savings, as well as a significant reduction in labor-intensive activities can be expected.

Another significant and important object of the instant invention is to provide a means for producing the composite article of manufacture of the type characterized herein involving non-planar support structures.

Other features, and important characteristics of the instant invention will be further realized as this new and novel method is further detailed hereinafterwards.

SUMMARY OF THE INVENTION AND OBJECTS

Fundamentally, the present invention consists of a new and novel method for forming an integral composite structure having predetermined electrically conductive networks on a non-conductive preformed support structure, whether planar or non-planar, which is formed by the combination of a relatively non-conductive slurry of electrically conductive materials having a fluid carrier which includes an evaporative fluid and an elastomeric substance in which particles of an electrically conductive material are suspended, the fluid carrier being chemically reactive with the material forming the relatively non-conductive support structure so that following the combination of the slurry with the support structure the carrier reacts chemically with the support structure to create a bond therebetween and upon evaporation of the evaporative portion of the fluid carrier, the unevaporated portion of the slurry formed of the elastomeric substance and the electrically conductive particles form a solid which is electrically conductive and is secured to the non-conductive portion of a preformed non-planar support structure, and method for producing same, including the steps of introducing the slurry into a container formed of materials which are non-reactive with the slurry, the container having a portion of the wall forming the container consisting of an elastomeric material having at least one orifice therein arranged in a desired pattern, to produce said network pattern on the preformed support structure, juxtapositioning the wall having the orifice therein relative to the support structure upon which the slurry is desired to be deposited upon, pressurizing the slurry within the container to force the slurry through the said at least one orifice, depositing the slurry passed through said at least one orifice onto the electrically non-conductive support structure, allowing the fluid carrier in the slurry to chemically react with the material forming the support structure, and then allowing the fluid carrier to evaporate leaving a flexible solid residue which is electrically conductive and is integrally secured to the support structure to form an integral composite structure having predetermined electrically conductive networks.

One object of the present invention is to provide a new and novel advance in the state of the art of the methods for installing, supporting and forming electrically conductive pathways deposited and bonded as an integral part of the device to be electrically powered.

Another object of the instant invention is to provide a new and novel method to the integration of electrically conductive pathways on a non-electrically conductive base such as preformed plastic parts formed by such processes as injection molding, and the like, great economies, in terms of time, expense, weight, and space savings, as well as a significant reduction in labor-intensive activities can be expected.

Another object of the present invention is to provide a method of the character and type disclosed herein which is able to control the amount of conductive ink deposited onto the preformed support structure without the use of intermediate patterns such as are inherent in the use of the silk screening method.

A yet still further object and primary purpose of the instant invention is to provide a method for precisely controlling the amount of electrically conductive ink to be through the application of pressure on the conductive ink supply.

It is another object and important purpose of the invention to limit the exposure of the ink to the air to only that ink which is being deposited onto the preformed support structure.

Another object of the invention is to substantially reduce the amount of ink which is lost following cessation of production of the combined electrically conductive ink and preformed support structure.

A yet still further object of the instant invention is to be able to have electrically conductive paths that are not necessarily planar in form.

BRIEF DESCRIPTION OF THE DRAWINGS:

FIG. No. 1 is a cross-sectional elevational view of the apparatus for carrying out the method described herein.

FIG. No. 2 is a view taken along Plane A—A of FIG. No. 1 of one form of the elastomeric, self-closing ink feed device.

Figure 1:
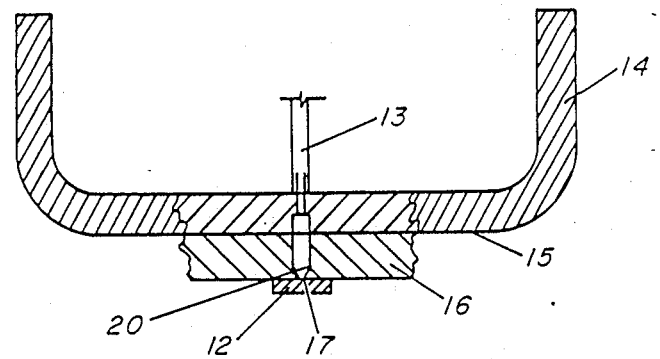
Figure 2:
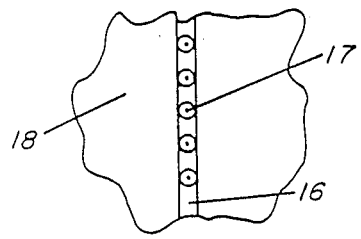

FIG. No. 3 is a view taken along Plane A—A of FIG. No. 1 depicting an alternate form of the elastomeric self-closing, ink feed device.

FIG. No. 4 is a plan view of a sun visor incorporating the the unique integral composite structure with predetermined electrically conductive networks.

FIG. No. 5 is an enlarged view of the cross-sectional area of the cone-shaped orifice depicting the manner in which the pressurized ink is used for opening the outlet of the normally-closed orifice for deposition onto an electrically non-conductive support structure to form an integral composite structure.

FIG. No. 6 is an enlarged view of the cross-sectional area of the wedge-shaped orifice depicting the manner in which the pressurized ink is used for opening the outlet of the normally-closed orifice for deposition onto an electrically non-conductive support structure to form an integral composite structure.

DESCRIPTION OF THE PREFERRED EMBODIMENT OF THE INVENTION

With continuing reference to all of the Drawings herein, and, with specific emphasis now on FIG. No. 4, there is shown and depicted the new and novel invention which basically comprises an integral composite structure generally indicated at 10, and shown here specifically in the form of a illuminated vanity mirror portion of a sun visor for automobiles, and a method for integrally forming a desired electrically conductive networks or pathways 11 on a non-electrically conductive preformed support structure 12 consisting of a relatively inexpensive base material, such as cheap plastic.

Fundamentally, the subject invention incorporates a novel and unique integral composite structure generally depicted at 10 in FIG. No. 4 having one or more predetermined electrically conductive networks 11 secured to a non-electrically conductive preformed support structure 12, the non-electrically conductive preformed support structure 12 being either planar or non-planar, wherein the electrically non-conductive preformed support structure 12 is formed by the combination of a relatively non-electrically conductive slurry 13, or so-called "ink", as shown in FIG. No. 1, formed by the combination of solid particles of electrically conductive materials, and an evaporative fluid carrier and an elastomeric substance, such as a polymer. The fluid carrier is typically evaporative in air at ambient room temperature and is relatively chemically reactive with the material forming the relatively non-conductive preformed support structure 12 so that following the combination of the slurry 13 in a predetermined pattern with the preformed support structure 12, the fluid carrier reacts chemically with the preformed support structure 12 so that upon the evaporation of the evaporative portion of the fluid carrier, the unevaporated portion of the slurry 13 formed of the elastomeric substance and the electrically conductive particles will form a solid residue which is electrically conductive and is secured to the non-conductive predetermined portion of the preformed support structure 12, which may be planar or non-planar, and the method for producing same, including the steps of introducing the slurry 13 into a container 14 formed of materials which are non-reactive with the slurry 13, the container having a portion of the wall 15 forming the container 14 consisting of an elastomeric material 16 having at least one orifice 17 therein arranged in a desired pattern, juxtapositioning the wall having the orifice therein relative to the preformed support structure 12 upon which the slurry 13 is desired to be deposited upon, pressurizing the slurry 13 within the container 14 to force the slurry 13 through the said at least one orifice 17, arranged to produce the said network on the preformed support structure 12, depositing the slurry 13 passed through said at least one orifice 17, onto the electrically non-conductive preformed support structure 12, allowing the fluid carrier in the slurry 13 to chemically react with the material forming the preformed support structure 12, and then allowing the fluid carrier to evaporate leaving a flexible solid residue which is electrically conductive and is integrally secured to the preformed support structure 12 to form an integral composite structure having predetermined electrically conductive networks, such as is depicted generally at 10 in FIG. No. 4 as the base for an electric light illuminated vanity mirror for a sun visor assembly for automobiles and the like.

The preferred means for forming such a composite, integral structure 12 by the within method includes the use of slurry 13 formed by a mixture of such materials which may or may not be relatively electrically conductive in a slurry form but which will become relatively electrically conductive when the slurry is being cured in order to form an electrically conductive coating 11 on a non-electrically conductive base material forming the preformed support structure 12, including the steps of: introducing the slurry 13 into a container 14, the container 14 having a portion of the container wall incorporating an elastomeric material 16 having at least one normally closed orifice 17 therein and, the orifices, if a plurality, are arranged in a desired pattern, selecting the quantity of the slurry 13 to be moved from the container 14 through the orifice 17 by the combination of pressure and the time duration of such pressure applied to the slurry 13 inside of the container 14, depositing the slurry 13 so selected and moved outside of the container 14 via the orifice 17, or orifice pattern generally shown at 18, onto the preformed support structure 12 to form a predetermined pattern on the structure 12, allowing the slurry 13 to chemically react to form a composite structure and, concurrently evaporating the fluid in the slurry 13 thereby leaving a electrically conductive residue forming an electrically conductive network which is secured to the preformed support structure 12. Many of the inks 13 are, prior to solidification in their slurry form, are non-electrically conductive. Such inks 13 become conductive upon solidification or curing.

Because such inks 13 are curable upon exposure to air, such inks 13 cannot be exposed to air prior to deposition onto the preformed support structure 12 or the ink 13 will cure or solidify and will not flow from the container to the preformed support structure 12 onto which such ink 13 is to be deposited. Accordingly, the orifice 17 through which the ink 13 is fed for deposition onto the preformed support structure 12 must be kept closed to prevent exposure of the ink 13 to air to prevent premature curing or solidification of the ink 13 prior to its being deposited onto the preformed support structure 12. Consequently, the orifice 17 must be normally closed to prevent premature exposure of the ink 13 to air.

Figure 5:
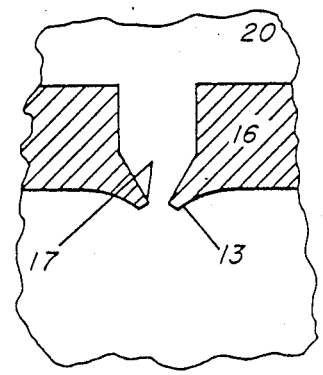
Figure 3:
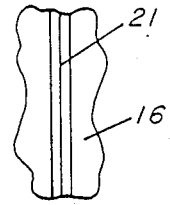

In the within preferred embodiment, the normally nearly closed orifice 17 is formed by a wedge-shaped or cone-shaped aperture 21 through a wall 16 formed of an elastomeric material. The orifice 17, by virtue of its size relative to the larger diametered portion of the wedge-shape or cone-shaped aperture 20 and to the viscosity of the ink 13, will not allow the ink 13 to flow therethrough absent sufficient pressurization of the containerized ink, and, because of this, it is effectively referred to as being "normally closed", even though, in reality, it consists of a relatively small, pinhole as shown in FIG. No. 3. With the use of an elastomeric material, such as Silicone, when the ink 13 within the container 14 is pressurized, the ink 13 is forced into the cone-shaped orifice 20, and upon reaching a selected pressurization level, the elastomeric material surrounding the pin-hole outlet 17 is caused to be outwardly deformed thereby increasing the size of the outlet 17 to a much larger diametered opening as shown in FIG. 5 of the Drawings as the elastomeric material is moved away from its at rest, or normally closed, pinhole-sized opening 17. As the orifice outlet 17 is enlarged, the ink 13 is directed from the inside of the container 14, through the larger diametered portion of the coneshaped orifice 20, and out the increased diameter of the normal pin-hole sized opening 17. Once exited from the increased diameter of the normal pin-hole sized opening 17, the ink 13 is deposited on the preformed support structure 12 in the pattern desired.

It should be noted at this time that the pin-hole sized opening 17 is preferrably in the range of from 0.001 to 0.005 inches in diameter, whereas, the largest diametered portion of the cone-shaped orifice 20 is preferred to be 0.0625 inches and larger.

Figure 6:
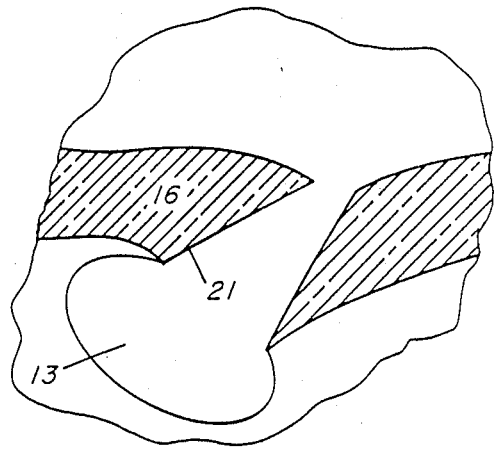
Figure 4:
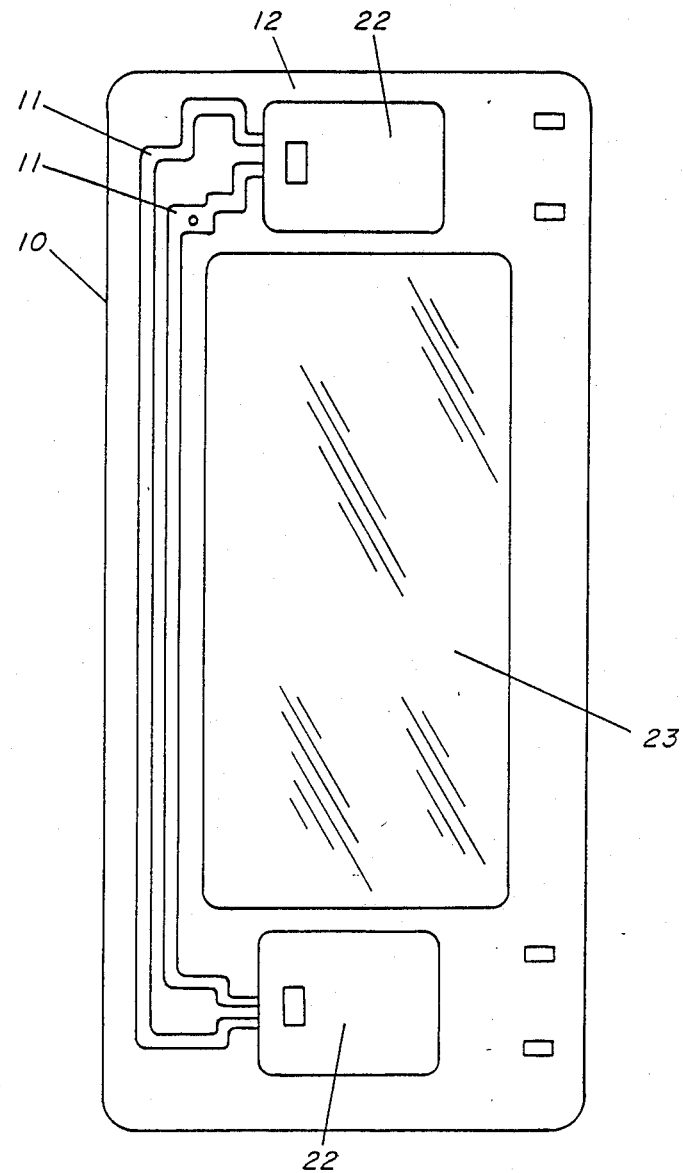

Additionally, the preferred embodiment described herein may readily utilize a wedge-shaped opening 21 as depicted in FIG. No. 6 in place of the cone-shaped orifice 20 as shown in an enlarged form in FIG. No. 5. Both FIGS. 5 and 6 show the pressurized ink 13 exiting the orifices 17 and 21 from the pressurized container 14 to the exterior of the elastomeric substance 16 surrounding the orifices 17 and 21 and which is ready for deposition onto the preformed support structure 12.

The amount of the residue is, everything else being relatively constant, dependent upon the amount of the ink 13 forced through the patterned orifice or orifices 17 which is determined by the combination of the magnitude of the pressure applied to the ink 13 within the container 14 and the duration of such applied pressure. Once the ink 13 is passed through the patterned orifice, or orifices, 17, the ink 13 is formed in the pattern of the orifice 17 and such patterned ink 13 is deposited on the preformed support structure 12 by one of two different methods.

One method involves the movement of the preformed support structure 12 into direct contact with the patterned ink 13 and, once contacted, the surface tension of the ink 13 so contacted assists in the transfer of the patterned ink 13 onto the preformed support structure 12. Following such contact, the preformed support structure 12 is moved away from such contact to its former position relative thereto.

Another method involves the movement of the patterned ink 13 to the preformed support structure 12. Once the ink 13 is contacted, the surface tension of the ink 13 so contacted assists in the transfer of the patterned ink 13 onto the preformed support structure 12.

Each method is desirable and offers certain features which are useful in different situations and various combinations of hardware and tooling.

The ink 13 of materials, preferably electrically conductive particles, such as silver metal, non-Noble metals, aluminum metal, nickel metal, and the like, suspended in a fluid with a polymer base, also referred to as inks, which upon exposure to air, or relatively high temperature, or infrared rays, or ultraviolet rays, or the like, for effectuating solidification of the ink 13 forms an electrically conductive solid coating, which if, prior to such solidification is deposited on such a relatively non-electrically conductive support structure 12 material will adhere to such an electrically non-conductive preformed support structure 12, such as preformed plastic parts, such method including the steps of introducing the ink 13 into a container 14 adapted for pressurization, the container 14 having a portion of the wall forming the container 14 formed of a flexible elastomeric substance, such as rubber, silicone, or the like, including one or more cone shaped, hollowed out portions within the flexible elastomeric substance, the larger portion of the cone shaped portion adapted for fluid communication with the ink 13 contained inside the container 14 and the smallest portion of the cone 20, or its apex, contacting the outer surface and forming a relatively small orifice therein for delivering the ink 13 therethrough, juxtapositioning the wall having the orifice 17 therein relative to the preformed support structure 12 upon which the ink 13 is desired to be deposited upon, and pressurizing the ink 13 to the desired level of pressurization within the container 14 to force the ink 13 through the orifice 17 formed in the apex of the cone-shaped, hollowed out portion onto the electrically non-conductive preformed support structure 12 and when cured to form a solid material which is electrically conductive and which adheres to an electrically non-conductive preformed support structure 12.

One of the key elements of the ink 13 is that it must contain some volatile, evaporative fluid carrier 15 such as Acetone, or some other form of fluid carrier which upon contact with plastic material of which the preformed support structure 12 is typically formed will react with and/or partially dissolve such material. By such chemical interaction between the solvent/carrier of the ink 13 and the electrically non-conductive preformed support structure 12, upon vaporization of the solvent/carrier from the ink 13, solidification occurs and such solid becomes an integral part of the electrically non-conductive preformed support structure 12, thereby forming a composite structure 10 with predetermined electrically conductive networks formed therein.

The net result is a very low cost, high production volume method for producing a composite structure 10 with predetermined electrically conductive networks formed therein. Such a structure has vast applications through many product areas. One such immediate application is the formation of an auto sun visor vanity mirror and electrical light assembly which incorporates relatively low cost electrically conductive pathways 11 instead the more expensive, relatively high cost electrical wiring, or stamped metal parts, which has been traditionally incorporated in such an application.

The pattern of the electrically conductive pathways 11 can be determined by several different methods. One method would be the wedge-shaped orifice 21 in the form of a slot, whether arranged in a straight line or a contoured line in the shaped of the pattern desired for deposition of the slurry or "ink" 13 onto the preformed support structure 12. Another method for establishing a pattern of the electrically conductive pathways 11 is to arrange a plurality of cone-shaped orifices 17 in the pattern desired in the elastomeric material in which the orifices 17 are formed.

One of the applications to utilize the within new and unique method and tooling means for effectuating the deposition of an electrically conductive slurry, or ink 13, onto a preformed support structure 12 is the creation of a an electrically lighted combination vanity mirror and sun visor assembly for vehicles which structure 12 is shown in FIG. No. 4. As depicted in FIG. No. 4, there is shown a vanity mirror and lighting assembly generally indicated at 10, with electrically conductive pathways 11 formed by the ink deposition and application methodology described herein, a pair of electric light bulb housings 22, and a mirror 23.

It is understood that the present invention is not limited to the particular construction and arrangement of parts disclosed and illustrated herein, but encompasses all such modified forms thereof as come within the scope of the following claims:

What we claim as our invention is:

1. An integral composite structure having predetermined electrically conductive networks on a relatively non-electrically conductive preformed support structure, said composite structure being formed by the combination of a slurry containing electrically conductive materials having a fluid carrier which includes an evaporative fluid and an elastomeric substance in which particles of an electrically conductive material are mixed, said fluid carrier containing elements which are chemically reactive with the material forming the relatively non-electrically conductive preformed support structure so that following the combination of the slurry with the preformed support structure the fluid carrier reacts chemically with the preformed support structure to form a bond therebetween and upon evaporation of the fluid portion of the ink, a residue remains forming a flexible and electrically conductive material arranged in a desired pattern secured to the preformed support structure.

2. The integral composite structure of claim 1 wherein the slurry is essentially non-electrically conductive.

3. The integral composite structure of claim 1 wherein said relatively non-electrically conductive preformed support structure is planar.

4. The integral composite structure of claim 1 wherein said relatively non-electrically conductive preformed support structure is non-planar.

5. The integral composite structure of claim 1 wherein said relatively non-electrically conductive preformed support structure is formed of plastic material.

6. The integral composite structure of claim 5 wherein said relatively non-electrically conductive preformed support structure consists of injection molded plastic material.

7. The integral composite structure of claim 6 wherein said relatively non-electrically conductive preformed support structure is formed of injection molded plastic material which forms a part of an electrically lighted combination vanity mirror and sun visor assembly for vehicles.

8. The integral composite structure of claim 7 wherein said predetermined electrically conductive networks in the sun visor comprises an electrically conductive network for conducting electrical power to the electrical lights and switches mounted in the electrically lighted combination vanity mirror and sun visor assembly for vehicles.

9. The integral composite structure of claim 1 wherein said slurry containing electrically conductive materials having a fluid carrier containing an evaporative fluid and an elastomeric substance in which particles of an electrically conductive material are mixed is an ink.

10. A method for forming an integral composite structure having predetermined electrically conductive networks on a non-conductive preformed support structure which is formed by the combination of a relatively non-conductive ink of electrically conductive materials having a fluid carrier, the fluid carrier having an evaporative fluid and an elastomeric substance in which particles of an electrically conductive material are suspended, the fluid carrier additionally containing elements which are chemically reactive with the material forming the relatively non-conductive preformed support structure so that following the combination of the ink with the preformed support structure the carrier reacts chemically with the preformed support structure to create a bond therebetween and upon evaporation of the evaporative portion of said carrier leaves an flexible electrically conductive residue arranged in a desired pattern:

(a) introducing the ink into a container adapted for pressurization, the container having a portion of its wall formed of a flexible elastomeric substance such as silicone, or the like, the wall formed by the elastomeric substance having at least one orifice therein, the inlet to the orifice being in fluid communication with the ink inside the container, and the outlet of the orifice being in fluid communication with the environment surrounding the exterior portion of the container;

(b) orifice closure means formed as an integral part of the elastomeric substance forming at least a portion of the wall of the container, the orifice closure means operative so that it is normally closed when the ink inside the container is not pressurized;

(c) orienting the outlet of the orifice therein relative to the preformed support structure as desired;

(d) juxtapositioning the outlet of the orifice therein relative to the preformed support structure as desired;

(e) pressurizing the ink in the container to a level sufficient to force the ink through the orifice inlet, through the orifice, open the orifice closure means and to force the ink through the orifice outlet;

(f) timing means for maintaining the pressurization of the ink in the container for the desired period of time;

(g) patterning means for creating the desired ink pattern on the preformed support structure;

(h) means for depositing the ink flowing from the orifice outlet onto the preformed support structure;

(i) means for securing the ink to the material forming the preformed support structure; and (j) means for solidifying the ink.

11. The method for forming an integral composite structure of claim 10 wherein the orifice closure means formed as an integral part of the elastomeric substance forming at least a portion of the wall of the container, the orifice closure means operative so that it is essentially normally closed when the ink inside the container is not pressurized, comprises:

(a) an elastomeric wall having a cone shaped passageway therethrough forming an orifice, the orifice having an inlet and an outlet, the inlet being in fluid communication with the interior of the container, and the outlet being in fluid communication with the exterior of the container, the inlet having a larger diameter than the diameter of the outlet, the diameter of the outlet being in a range of essentially from one thousandths of an inch to five thousandths of an inch, such inlet diameter being sufficiently small to prevent the unpressurized ink from passing therethrough, thereby being essentially normally closed; and (b) pressurizing the ink in the container to force the ink into the inlet of the orifice and to the outlet thereof, and to cause the elastomeric material surrounding the orifice outlet to be deformed outwardly thereby increasing the diameter of the outlet sufficient to allow the pressurized ink to flow therethrough.

12. The method for forming an integral composite structure of claim 10 wherein the orifice closure means formed as an integral part of the elastomeric substance formed by a cut through the wall of the container at least a portion of the wall of the container, and the orifice closure means is essentially a wedge-shaped flap-valve type of orifice.

13. The method for forming an integral composite structure of claim 10 wherein the patterning means for creating the desired ink pattern on the preformed support structure, comprises a plurality of orifices in the elastomeric wall arranged in the desired pattern to be replicated on the preformed support structure.

14. The method for forming an integral composite structure of claim 10 wherein the means for depositing the ink flowing from the orifice outlet onto the preformed support structure, comprises the steps of:
(a) juxtapositioning the outlet of the orifice with the preformed support structure;
(b) pressurizing the ink within the container to drive the ink from within the container through the outlet of the orifice for the desired period of time to drive the desired amount of ink therefrom onto the preformed support structure; and then
(c) withdrawing the outlet of the orifice from the preformed support structure.

15. The method for forming an integral composite structure of claim 14 wherein the step of juxtapositioning the outlet of the orifice with the preformed support structure includes contacting the exterior portion of the elastomeric wall surrounding the outlet of the orifice with the portion of the preformed support structure desired to receive the ink thereon after the ink is forced out of the outlet thereof.

16. The method for forming an integral composite structure of claim 10 wherein the means for securing the ink to the material forming the preformed support structure, comprises a chemical interaction between the material forming the preformed support structure and the ink is forced out of the outlet thereof.

17. The method for forming an integral composite structure of claim 10 wherein the means for solidifying the ink, comprises exposing the ink to air.

18. The method for forming an integral composite structure of claim 10 wherein the means for solidifying the ink, comprises exposing the ink to infrared radiation.

19. The method for forming an integral composite structure of claim 10 wherein the means for solidifying the ink, comprises exposing it to ultraviolet radiation.

* * * * *